US008981459B2

(12) United States Patent
Yan et al.

(10) Patent No.: US 8,981,459 B2
(45) Date of Patent: Mar. 17, 2015

(54) STRUCTURE AND MANUFACTURING METHOD OF A NON-VOLATILE MEMORY

(71) Applicant: MACRONIX International Co., Ltd., Hsinchu (TW)

(72) Inventors: Shih-Guei Yan, Hsinchu (TW); Wen-Jer Tsai, Hsinchu (TW); Chih-Chieh Cheng, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 0 days.

(21) Appl. No.: 13/869,300

(22) Filed: Apr. 24, 2013

(65) Prior Publication Data
US 2014/0264543 A1 Sep. 18, 2014

Related U.S. Application Data

(60) Provisional application No. 61/776,817, filed on Mar. 12, 2013.

(51) Int. Cl.
*H01L 29/792* (2006.01)
*H01L 21/336* (2006.01)
*H01L 27/115* (2006.01)
*H01L 21/28* (2006.01)

(52) U.S. Cl.
CPC .... *H01L 27/11568* (2013.01); *H01L 21/28282* (2013.01)
USPC .......................................... 257/324; 438/261

(58) Field of Classification Search
CPC ............ H01L 27/115; H01L 27/11532; H01L 27/11468; H01L 29/788; H01L 29/792; H01L 29/66825; H01L 29/66833; H01L 21/3085; H01L 27/11568; H01L 21/28282
USPC .......... 357/314, 315, 324; 438/257, 261, 287; 257/314, 315, 324
See application file for complete search history.

(56) References Cited

U.S. PATENT DOCUMENTS

| | | | | |
|---|---|---|---|---|
| 6,436,768 B1* | 8/2002 | Yang et al. | ..................... | 438/266 |
| 6,674,133 B2* | 1/2004 | Chang | ........................... | 257/391 |
| 6,936,887 B2* | 8/2005 | Harari et al. | .................. | 257/319 |
| 6,972,230 B1* | 12/2005 | Pan et al. | ...................... | 438/257 |
| 2005/0029578 A1* | 2/2005 | Nishizaka | ..................... | 257/315 |
| 2007/0297241 A1* | 12/2007 | Wu | .......................... | 365/185.25 |
| 2009/0061650 A1* | 3/2009 | Lee et al. | ...................... | 438/787 |

* cited by examiner

*Primary Examiner* — Nikolay Yushin
(74) *Attorney, Agent, or Firm* — J.C. Patents

(57) ABSTRACT

A semiconductor structure uses its control gate to be the wordline for receiving an operation voltage for the semiconductor structure. The semiconductor structure has a first and a second doped region and a buried channel between the first and the second doped region, wherein the buried channel has a first length along the first direction. The semiconductor structure further has a charge trapping layer stack on the buried channel and a conductive layer on the charge trapping layer stack, wherein the conductive layer extends along the first direction. The conductive layer is configured as both the control gate and the wordline of the semiconductor structure.

24 Claims, 18 Drawing Sheets

STRUCTURE AND MANUFACTURING METHOD OF A NON-VOLATILE MEMORY

CROSS-REFERENCE TO RELATED APPLICATION

This application claims the priority benefit of U.S. provisional application Ser. No. 61/776,817, filed on Mar. 12, 2013. The entirety of the above-mentioned patent application is hereby incorporated by reference herein and made a part of this specification.

FIELD OF THE INVENTION

The present invention relates in general to a novel structure of a memory and a manufacturing method thereof.

BACKGROUND

A non-volatile semiconductor memory array which can be widely used in various devices such as nitride read only memory, EEPROM, or Flash memory for retaining the memory even when the power is removed. FIG. 1A shows a top view of a conventional non-volatile memory array 10 which includes a grid of memory cells constructed by multi-layer process features. Invisible strips covered by a dielectric film 120 are the doped regions buried in the substrate and arranged as the source or drain for the memory cells. Conductive lines 140 are disposed in a parallel manner and orthogonal to the strips wherein the conductive lines 140 are usually called wordlines for the memory cells, and they are used to select a row of cells during the write or read operation. There is another conductive layer covered by the wordlines 140, and the conductive layer is arranged to act as the gate layer of each memory cell. Residues usually called stringer 160 are randomly formed along the sidewall of the dielectric pattern 120 after the etch step of conductive line 140. Ideally the gap between wordlines 140 should be free of any conductive material which may cause interference occurring between the wordlines.

For a better understanding of FIG. 1A, FIG. 1B is referred hereby to depict a cross-sectional view along line AA' in FIG. 1A. The dielectric film 120 laid over the doped region 110 is located on the substrate 100 and provides isolation for adjacent gate layer 130. A charge trapping layer, which is illustrated as an ONO (oxide-nitride-oxide) stack 135 is disposed between the substrate 100 and the gate layer 130. FIG. 1C depicts a cross-sectional view along line BB' and shows a region where there is supposed to be no gate layer 130 or wordline 140 existing.

FIGS. 2A to 2E-2 illustrate a portion of a conventional flow to produce the aforementioned memory array 10. Please also refer to FIG. 3A-3C while looking at the process flow. Steps of forming the ONO film 135 and the conductive gate layer 130 are skipped. FIG. 2A shows an etch step which is introduced to pattern the composite stack 130/135 into several strips wherein he composite stack 130/135 is etched to have a tapered sidewall. FIG. 2B shows the buried diffusion strips 110 are formed by an ion-implantation or a diffusion process. FIG. 3A is the corresponding top view of FIG. 2A. FIG. 2C illustrates that the dielectric film 120 is deposited to fill the gaps between the patterned composite stack 130/135 and an etch back or other planarization step is introduced to get a flat top surface. FIG. 3B is the corresponding top view of FIG. 2C. FIG. 2D (along AA') following FIG. 2C-1 shows depositing the conductive film 140 which lays on the top of the composite stack 130/135. Finally, an etch step is adopted to cut the conductive films into several conductive lines 140 as shown in FIG. 3C. FIG. 1B and FIG. 1C respectively shows the cross section along line AA' (wordline direction) and BB'. Apparently, according to the conventional design and process, the film stack 130/135 provides a site for the dielectric film 120 filling into the gaps to form a reversed tapered dielectric film 120. The conductive film 130 located on the side wall of the dielectric film 120 as shown in FIG. 1C may be difficult for the etch step to completely remove. Therefore, it is inevitable to leave conductive residues 160 more or less between the wordlines after the etch step. Hence, the interference such as cross talk caused by those conductive residues is a serious problem needs to be addressed.

SUMMARY OF THE INVENTION

The present invention discloses a semiconductor memory structure wherein the memory structure utilizes a wordline as its control gate in order to reduce the stacking thickness above the memory's charge trapping layer.

A semiconductor structure includes a first and a second doped region which can be source or drain of the structure. The semiconductor structure also has a channel having a length along a first direction and the channel is between the first and the second doped region. There is a charge trapping layer stack on the channel and a conductive layer disposed on the charge trapping layer, wherein the conductive layer extends along the first direction. The conductive layer is configured as the control gate of the semiconductor structure and as a wordline for receiving an operation voltage for the semiconductor structure.

The present disclosure further has a memory array including a plurality of memory storage units wherein the adjacent units along a first direction are separated by a buried diffusion region. The buried diffusion region extends along a second direction which is orthogonal to the first direction. The memory also has a conductive line which is designed to string the memory storage units along the first direction. In order to reduce the thickness stacking on the storage unit, the conductive line is configured as the control gate and the wordline of the storage unit.

A method of manufacturing a semiconductor structure includes forming a plurality of buried diffusion strips in a substrate, wherein the buried diffusion strips extend along a first direction. The method further forming a plurality of memory storage units on a substrate wherein the memory storage units are stringed by forming a wordline in a second direction which is orthogonal to the first direction. The wordline is the configured as the control gate for each storage unit.

BRIEF DESCRIPTION OF THE DRAWINGS

The invention will be described according to the appended drawings in which.

DETAILED DESCRIPTION OF THE INVENTION

The embodiments of the present invention are described more fully hereinafter with reference to the accompanying drawings, which form a part hereof, and which show, by way of illustration, specific exemplary embodiments by which the invention may be practiced. This invention may, however, be embodied in many different forms and should not be construed as limited to the embodiments set forth herein; rather, these embodiments are provided so that this disclosure will be thorough and complete, and will fully convey the scope of the invention to those skilled in the art. As used herein, the term "or" is an inclusive "or" operator, and is equivalent to the term "and/or," unless the context clearly dictates otherwise. In addition, throughout the specification, the meaning of "a," "an," and "the" include plural references. The term "coupled" implies that the elements may be directly connected together or may be coupled through one or more intervening elements.

Figure 4:
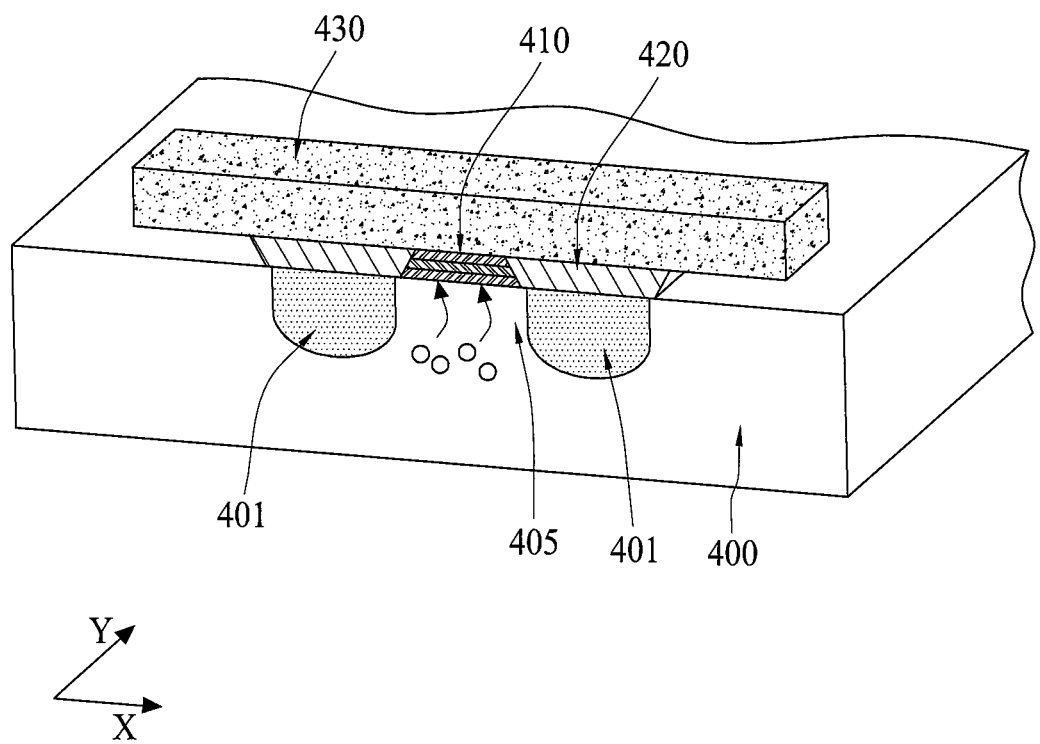
FIG. 4 depicts a semiconductor structure according to the present disclosure.

FIG. 4 illustrates a semiconductor structure 40 according to the present invention. The semiconductor structure 40 can be a MOS structure which forms on a substrate 400. The substrate 400 is of a first conductivity type. A first and second doped region 401 with a second conductivity type which is opposite to the first conductivity type, are in the substrate 400. A charge trapping layer stack 410 is disposed on the top surface of the substrate 400 and the charge trapping layer stack 410 can include a single film such as a floating gate structure or silicon nitride, and further includes a top and bottom dielectric layer to form a charge trapping layer stack (such as ONO or OPO stack). The charge trapping layer stack 410 is designed as a memory storage being able to trap the mobile carriers in a channel 405 when the mobile carriers injecting into the charge trapping layer stack 410 from the channel 405. The channel 405 is between the first and second doped region and the X direction is usually referred as the channel length direction. The semiconductor structure 40 further has a layer 420 wherein its top surface is coplanar with the top surface of the charge trapping layer stack 410. The layer 420 is composed with dielectric materials in order to isolate a conductive layer 430 from first and second doped region 401. A conductive layer 430 is on the charge trapping layer 410 and the conductive layer 430 is also a control gate adapted to operate the semiconductor structure 40 in various modes based on the bias applied. The conductive layer 430 is also extending along the direction of the channel length, the X-direction, to communicate with other similar semiconductor structures which also utilize the conductive layer 430 as a control gate. To be more specific, the conductive layer 430 is a wordline for the semiconductor structure 40, that is, the conductive layer 430 is also capable to receive an operation voltage from a control circuitry to allow writing, reading, or erasing a state stored in the semiconductor structure 40. In the present embodiment, since the conductive layer 430 is also the control gate of the semiconductor structure 40, an extra conductive layer as required in the conventional structure for the control gate is eliminated, hence the thickness of the gate is reduced.

Figure 1A:
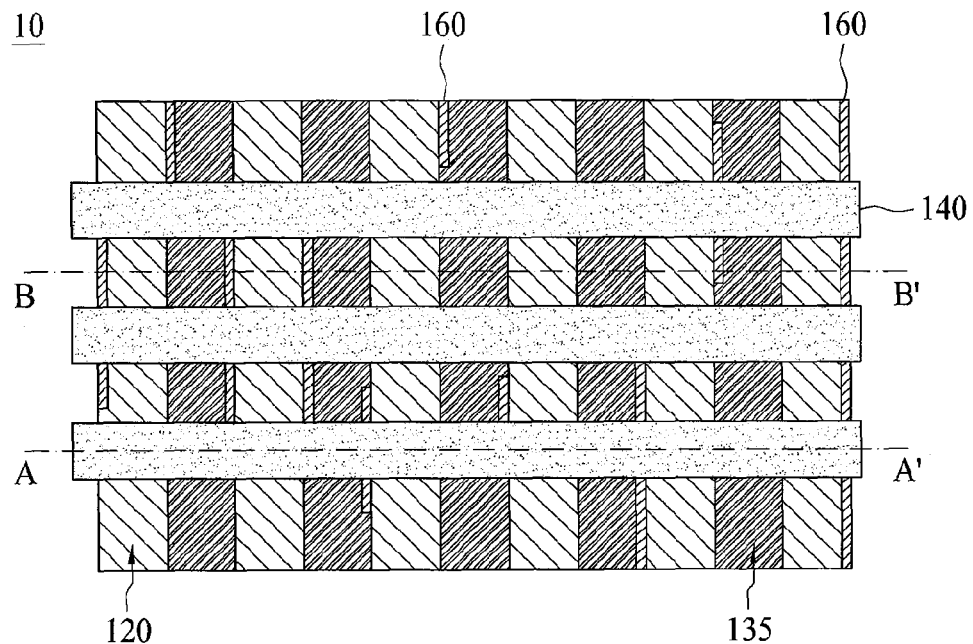
FIG. 1A-1C illustrate different perspective views of a conventional a conventional non-volatile memory array.
Figure 1B:
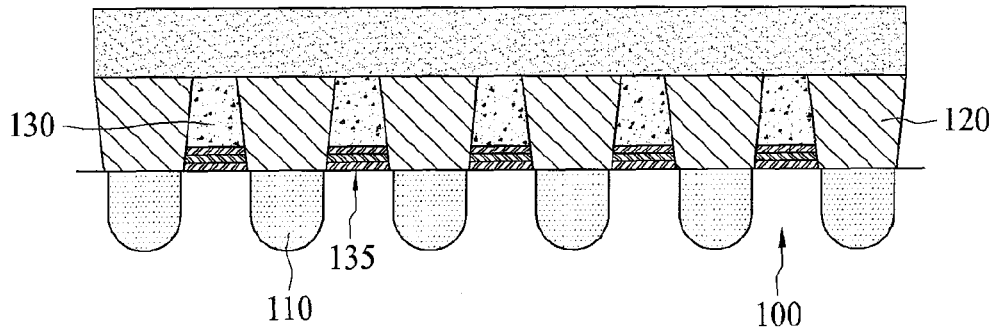
Figure 1C:
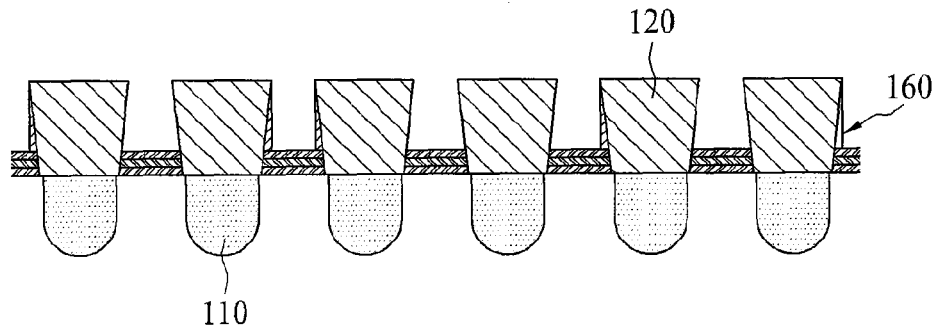
Figure 2A:
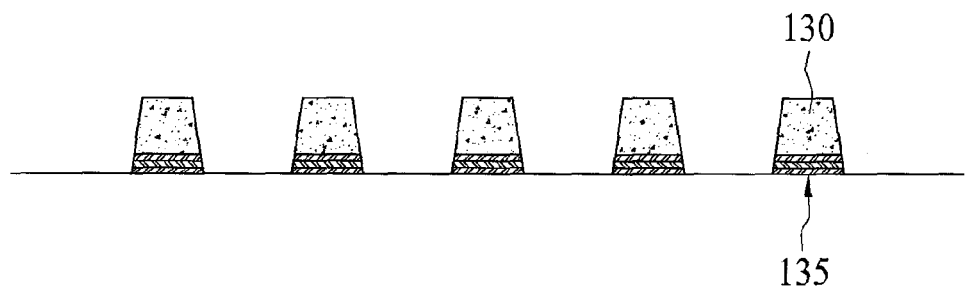
FIG. 2A to 2E-2 illustrate a process flow of manufacturing a conventional a conventional non-volatile memory array.
Figure 2B:
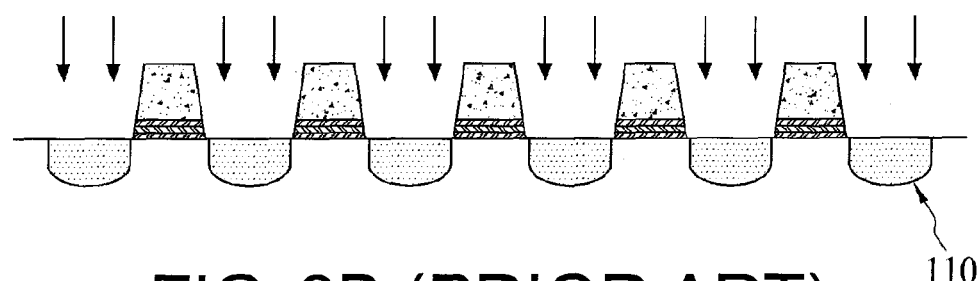
Figure 2C:
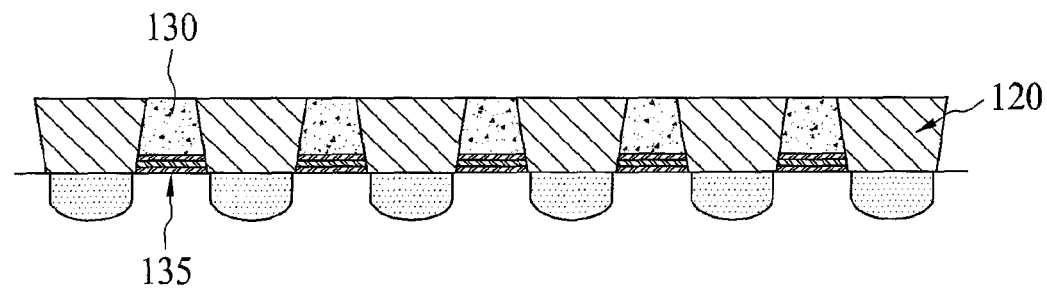
Figures 1, 2D:
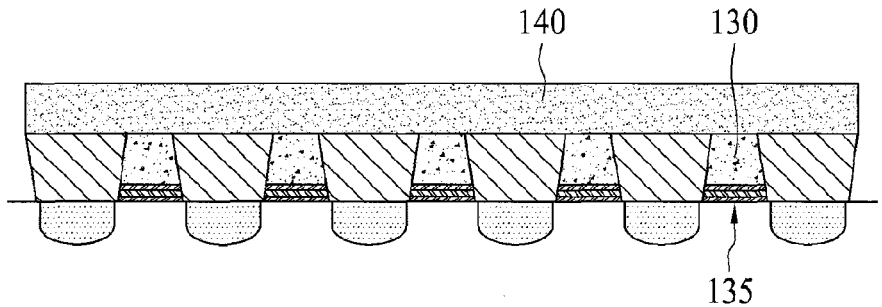
FIG. 5A-1-5K-3 illustrate a process flow of manufacturing a semiconductor structure and the corresponding top view drawings.
Figures 2, 2D:
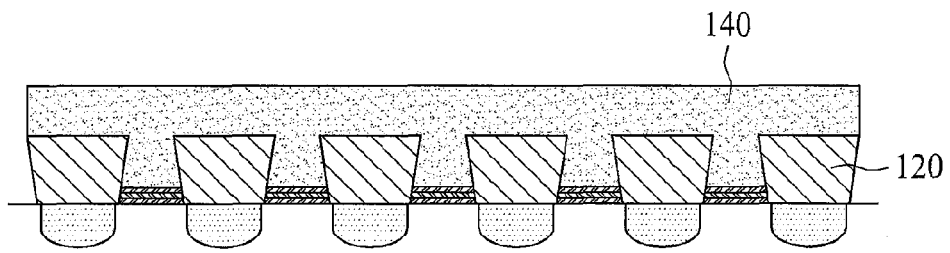
Figures 1, 2E:
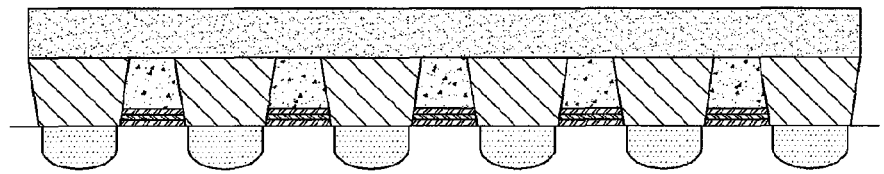
Figures 2, 2E:
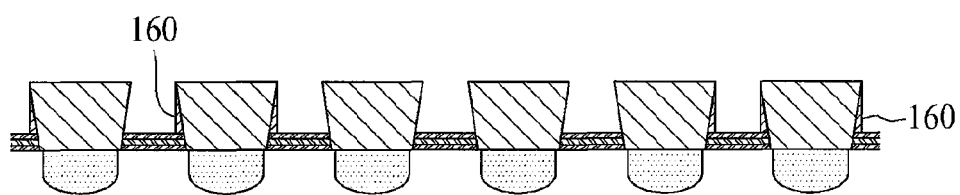
Figure 3A:
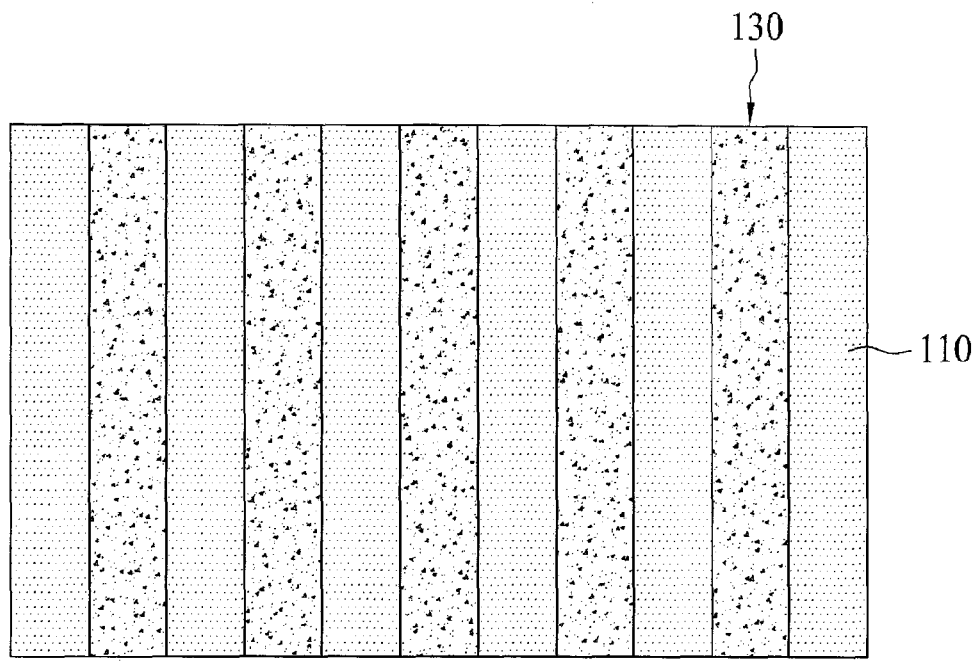
FIG. 3A-3C illustrate the corresponding top view of the drawings in FIG. 2A to 2E-2.
Figure 3B:
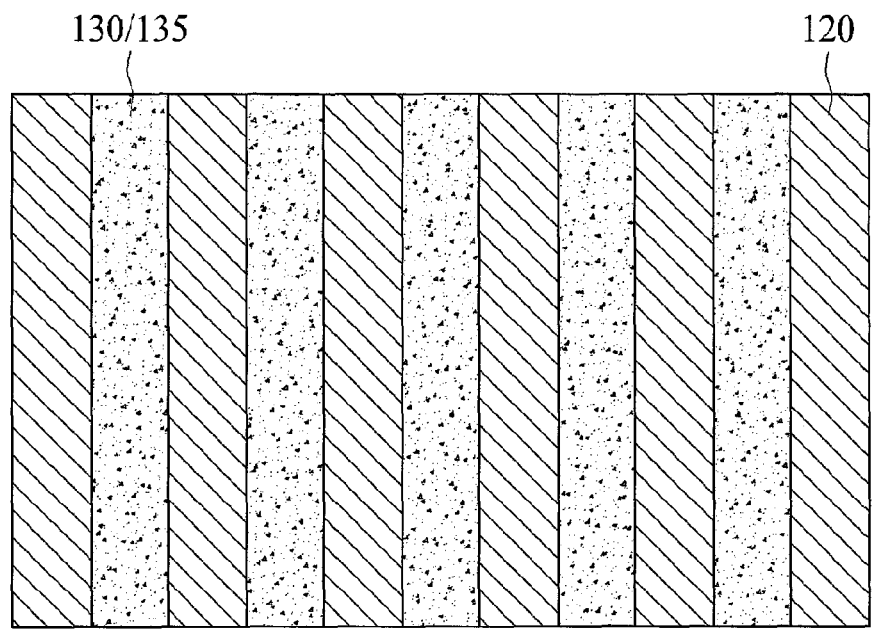
Figure 3C:
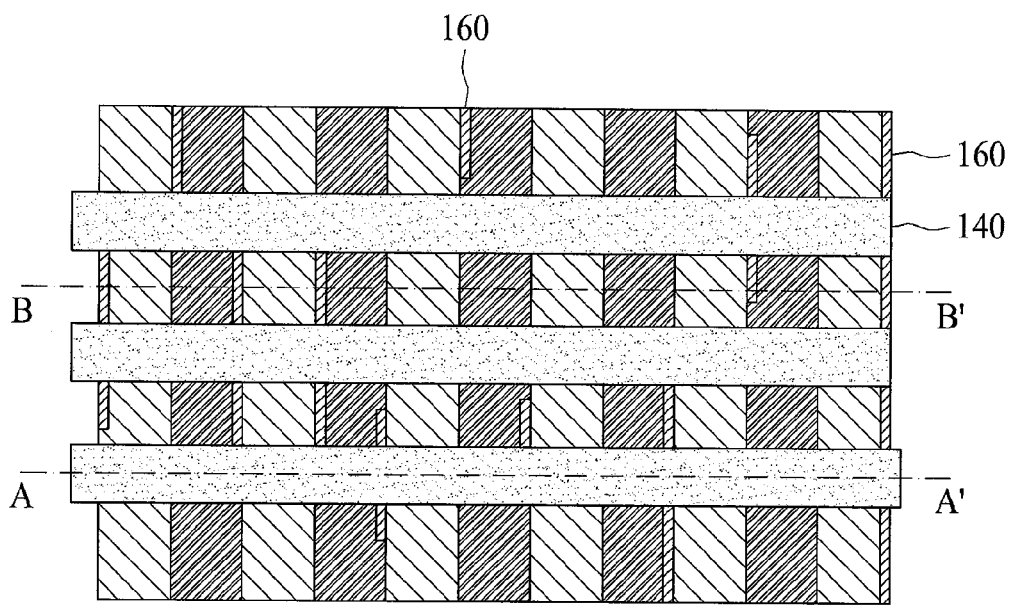
Figures 1, 5A:
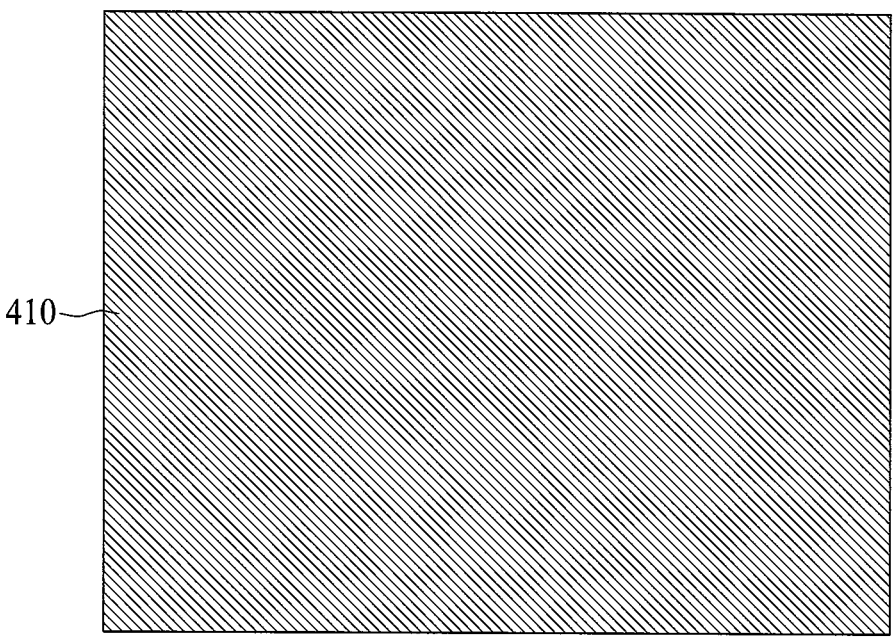
Figures 2, 5A:
Figures 1, 5B:
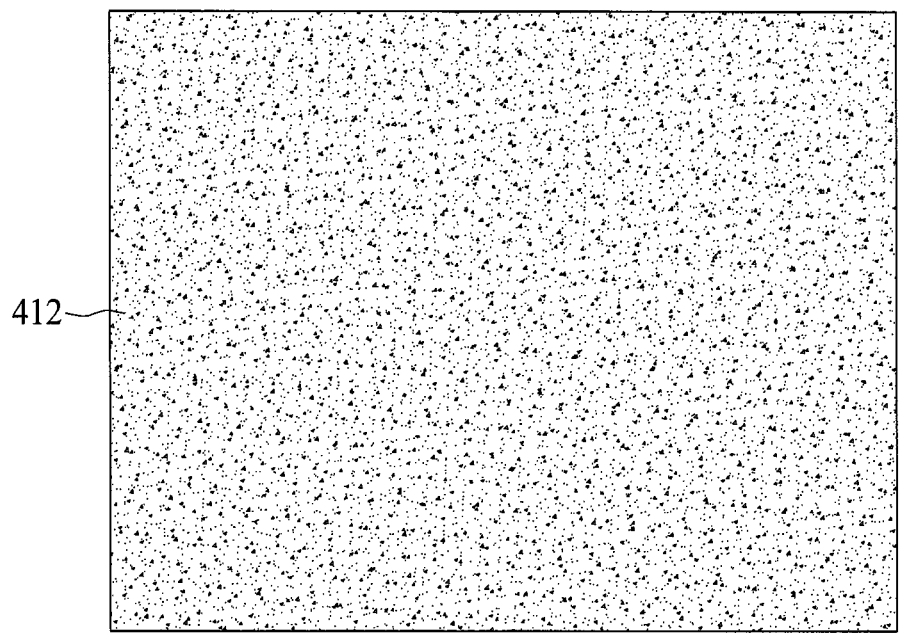
Figures 2, 5B:
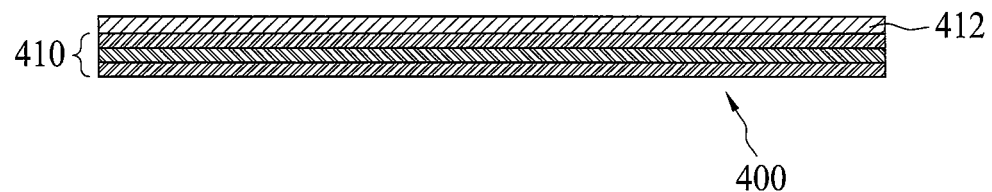
Figures 1, 5C:
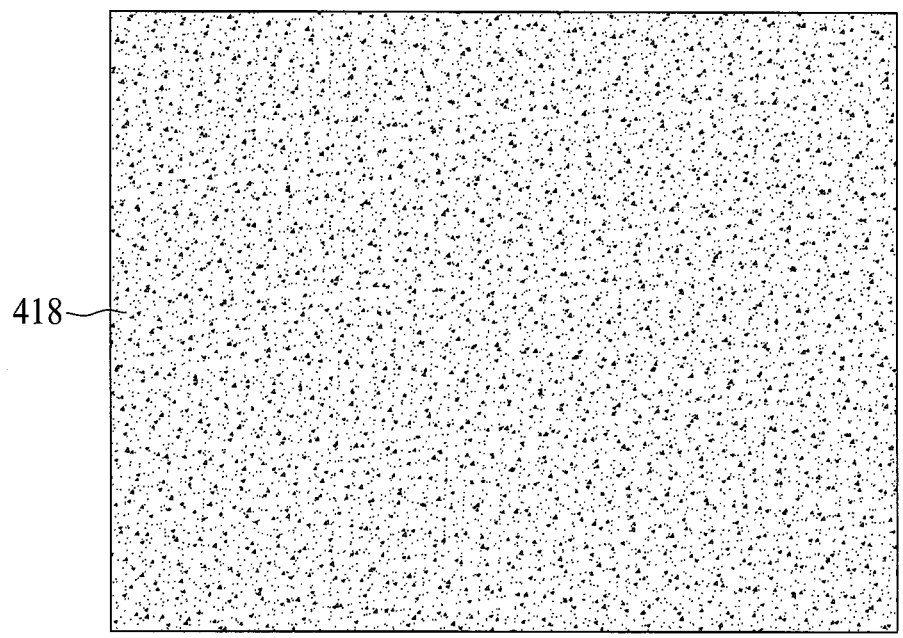
Figures 2, 5C:
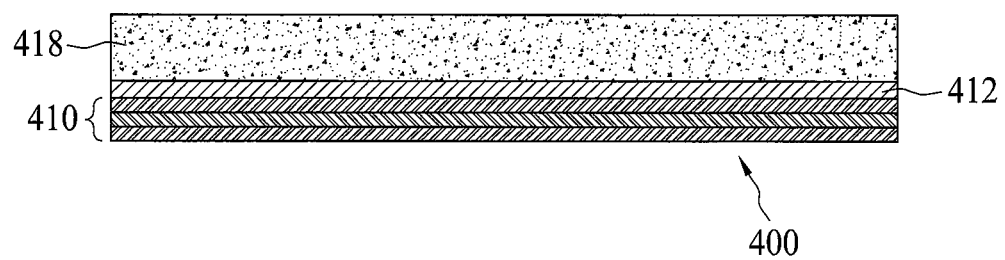

FIG. 5A-1 to 5K-3 illustrate a process flow to manufacture a semiconductor structure similar to the embodiment shown in FIG. 4. Each step is represented by a top view drawing and its corresponding cross-sectional drawing. FIGS. 5A-1 and 5A-2 show the charge trapping layer stack 410 is deposited on the substrate 400. A hard mask layer 412 is disposed on the charge trapping layer 410 as shown in FIGS. 5B-1 and 5B-2 and followed by a sacrificial layer 418 as in FIGS. 5C-1 and 5C-2. The sacrificial layer 418 can be formed by different materials such as silicon, silicon oxide, or silicon nitride. In one embodiment, the sacrificial layer 418 is formed by poly silicon. The step of forming the sacrificial layer 418 can be skipped in some embodiments if the hard mask layer 412 is capable of shielding the films underneath during the ion implantation process or the ion implantation process can be properly adjusted to reduce the damage.

Figures 1, 5D:
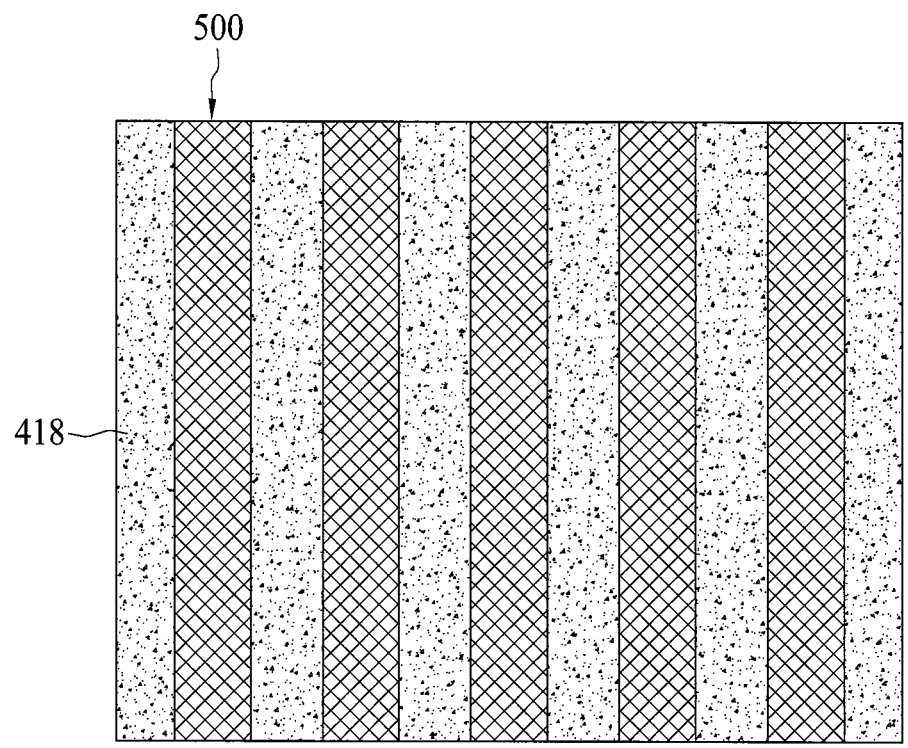
Figures 2, 5D:
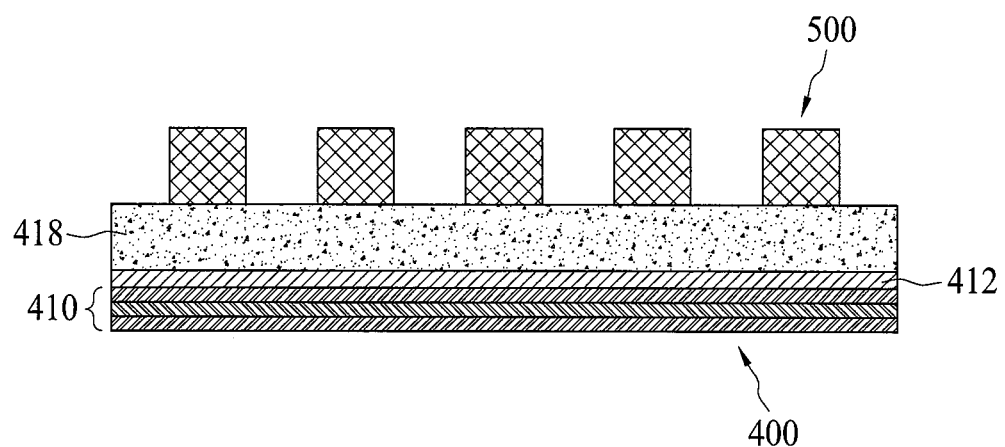
Figures 1, 5E:
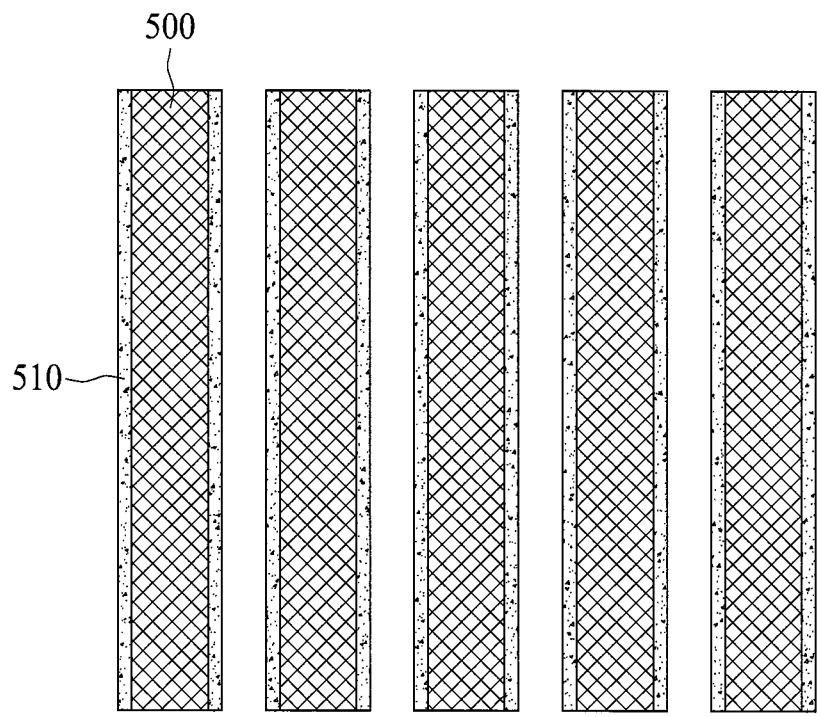
Figures 2, 5E:
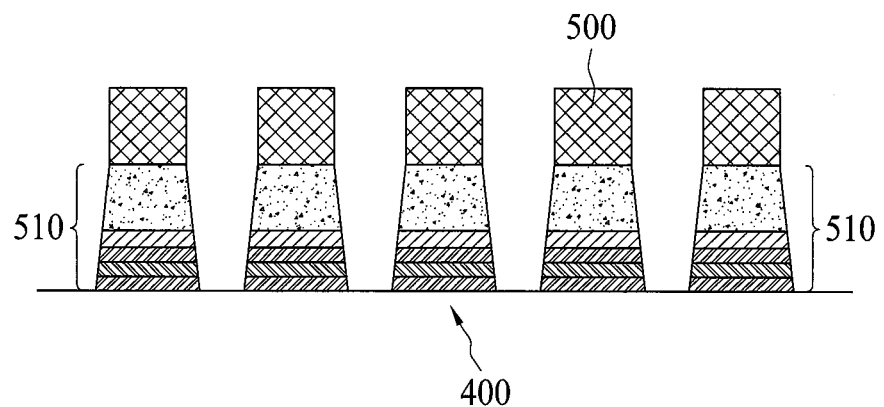
Figures 1, 5F:
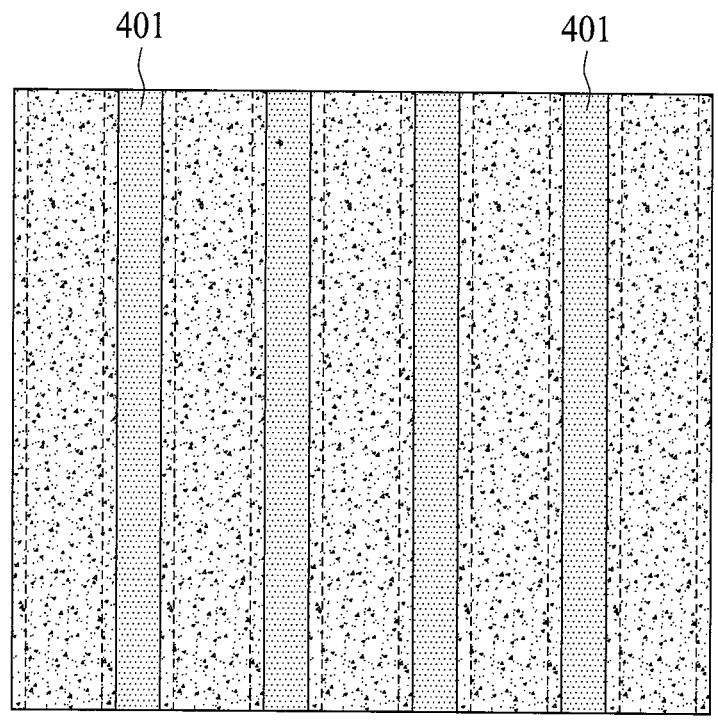
Figures 2, 5F:
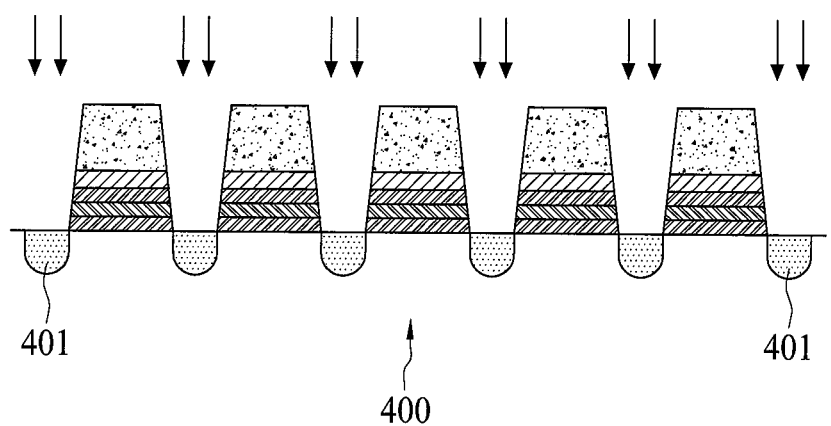
Figures 1, 5G:
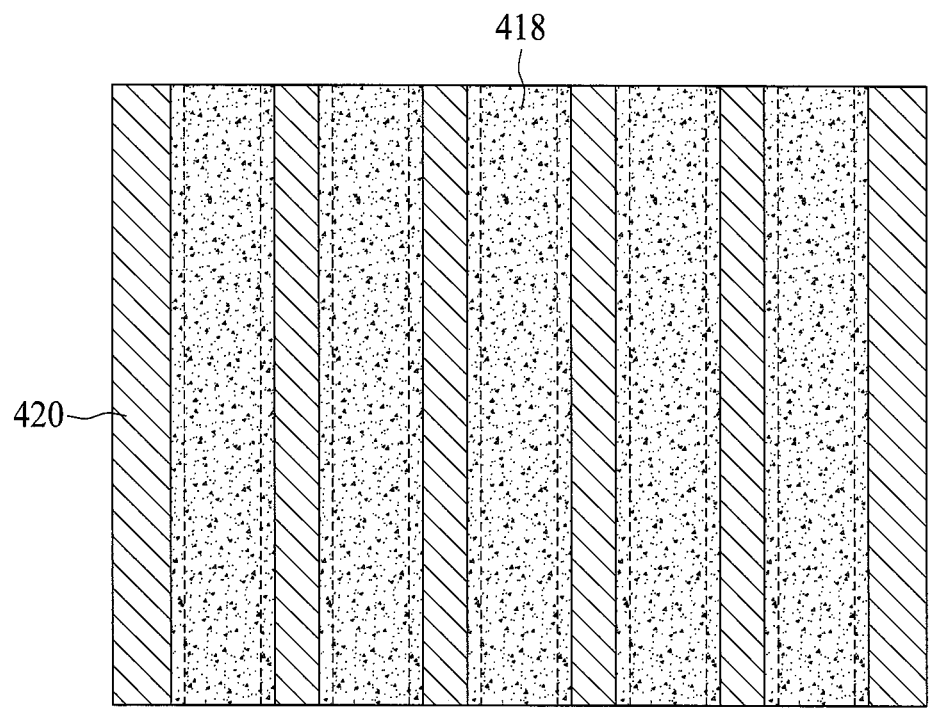
Figures 2, 5G:
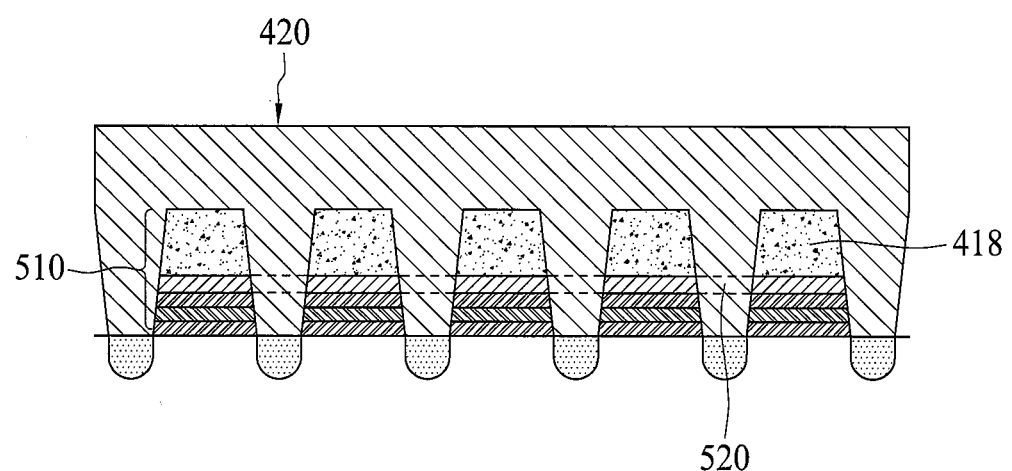

FIGS. 5D-1 and 5D-2 show a photolithography process is introduced to pattern a mask 500 on a portion of the top surface of the sacrificial layer 418 (if selected) and the uncovered region is arranged to be the buried diffusion areas for the substrate 400 receiving impurities. The mask 500 can be also a patterned hard film disposed on the sacrificial layer 418. An etch step is introduced to remove the excessive film, therefore the final shape of the sidewall of the film stack 510 (formed by the charge trapping layer stack 410, the hard mask 412 and the sacrificial layer 418) is tapered as shown in FIG. 5E-2. FIG. 5E-1 is the top view of FIG. 5E-2. The mask 500 is removed after forming the film stack 510 in order to continue the proceeding process. The impurities are inserted into the substrate 400 by ion implantation or diffusion process to form doped regions 401 as shown in FIGS. 5F-1 and 5F-2. The doped regions 401 can be either the source or drain according to the operation of each semiconductor structure 40. FIGS. 5G-1 and 5G-2 illustrate a dielectric film 420 is disposed on and also fills into the gaps 520 between the film stacks 510 to provide isolation thereof. A planarization process such as an etch back or a CMP (Chemical Mechanical Planarization) process is introduced to remove excessive dielectric film 420 on the top of the sacrificial layer 418 as shown in FIGS. 5H-1 and 5H-2.

A removing process such as a blanket etch can be further introduced to remove the dielectric film 420 and the sacrificial layer 418. The blanket etch is designed to have a low selectivity to the dielectric film 420 and the sacrificial layer 418. FIGS. 5I-1 and 5I-2 illustrate the top view and cross section after another removal process is introduced. The hard mask 412 is designed to be more resistant to the blanket etch step. In some embodiments, the dielectric film 420 is an silicon oxide film and the sacrificial layer 418 is a silicon film, and the hard mask 412 is a silicon nitride film. The blanket etch step can be stopped while the end point detector detects nitrogen signal which means the hard mask layer 412 is exposed. An over etch step can be optionally added to remove residues on the hard mask layer 412, especially the residues from the sacrificial layer 418, to ensure the operation reliability.

Figures 1, 5H:
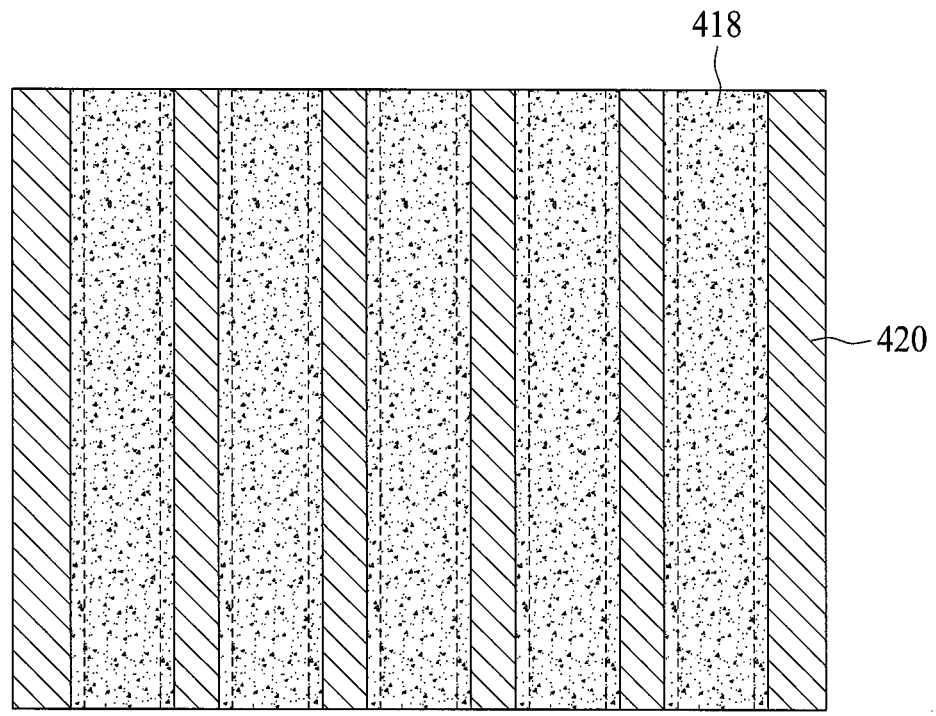
Figures 2, 5H:
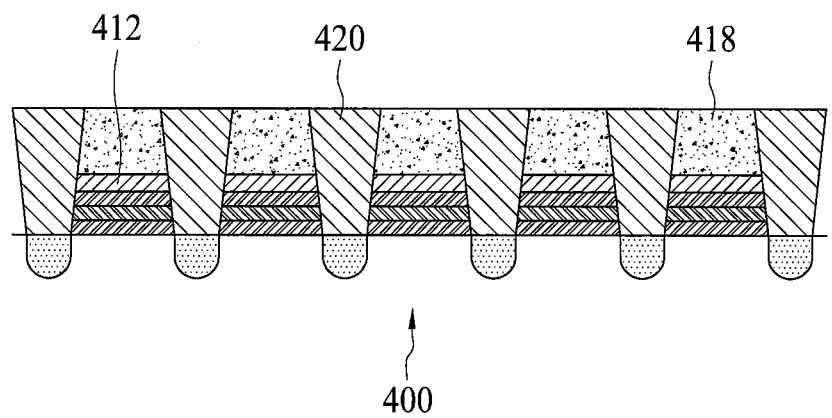
Figures 1, 5I:
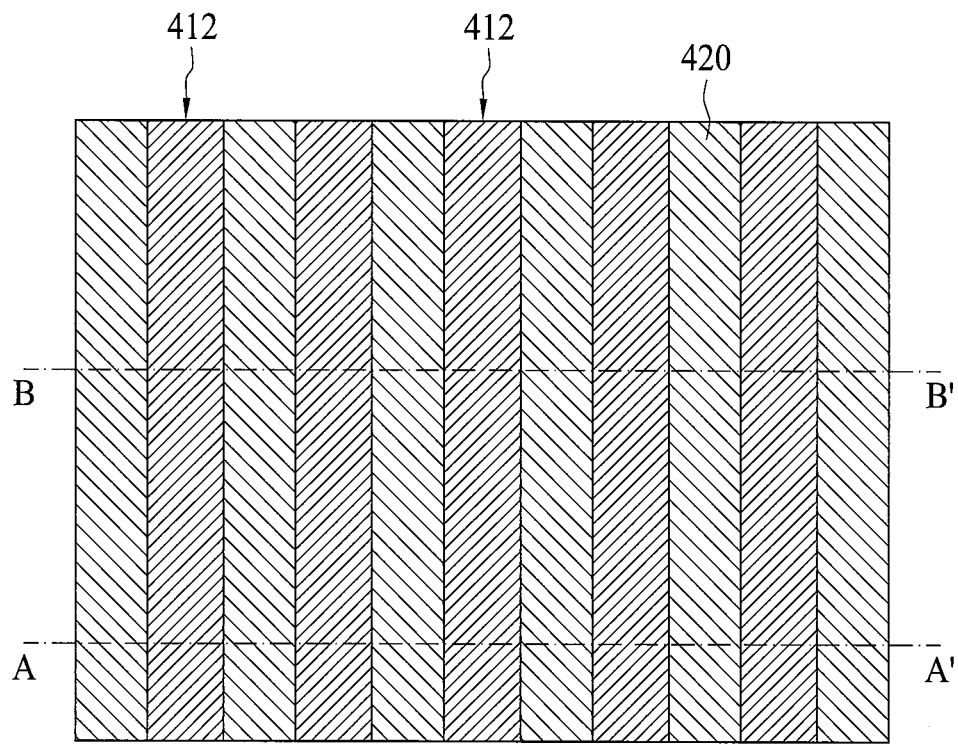
Figures 2, 5I:
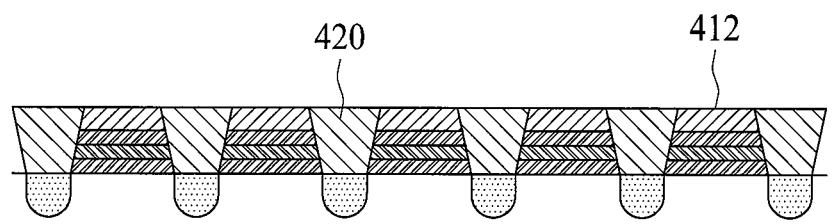
Figures 1, 5J:
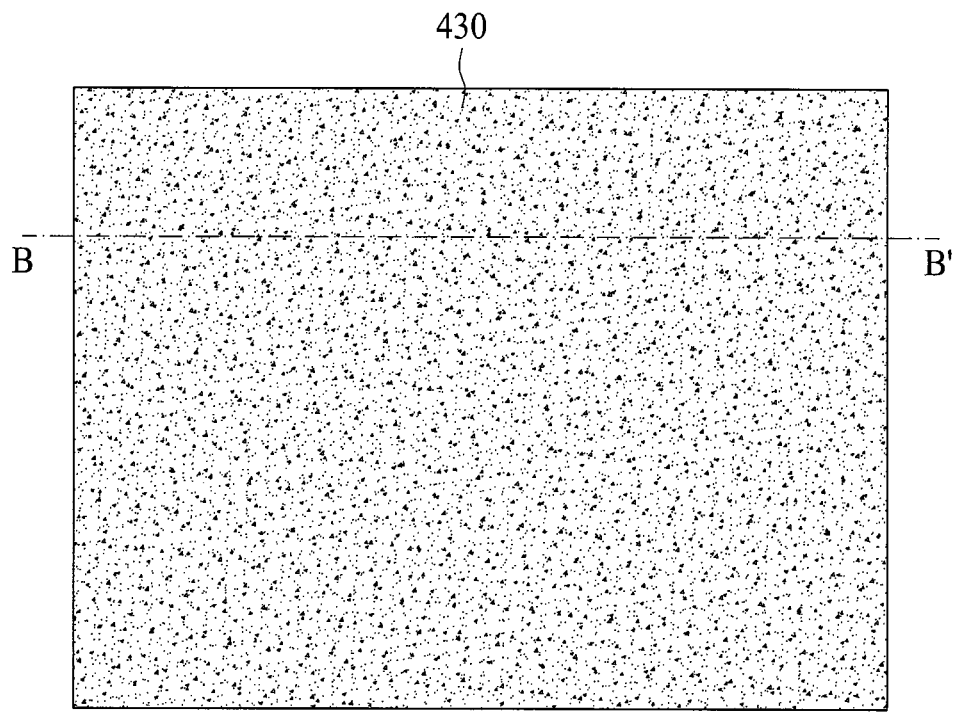
Figures 2, 5J:
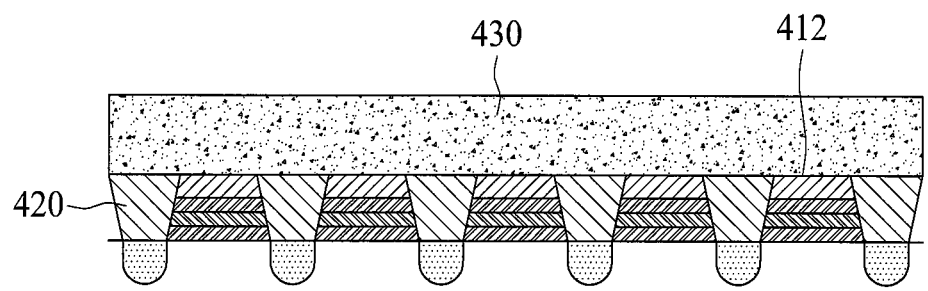
Figures 1, 5K:
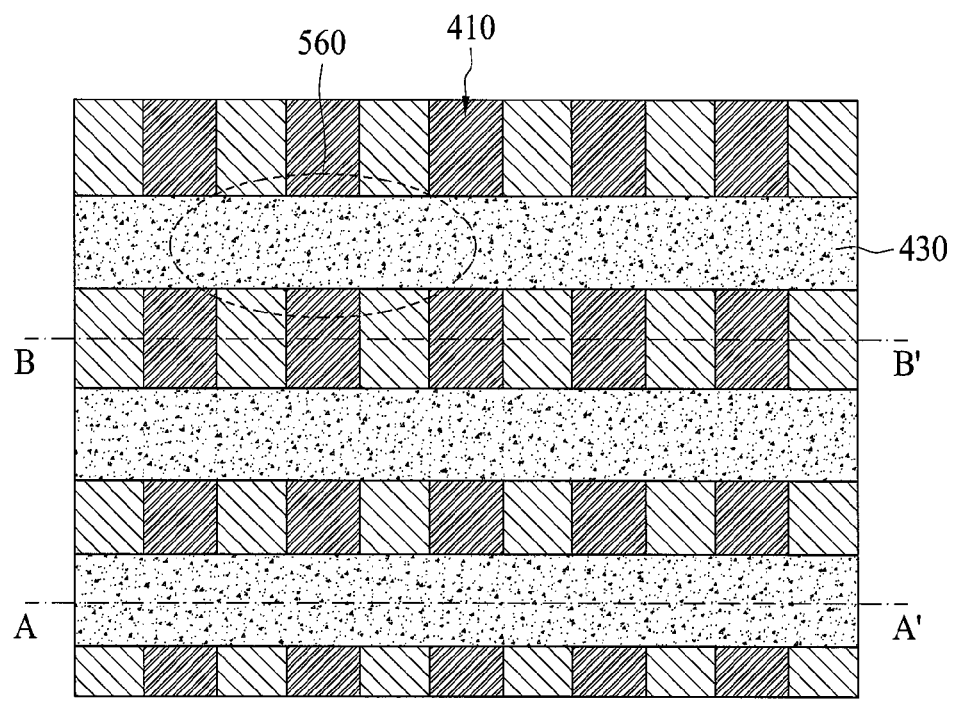
Figures 2, 5K:
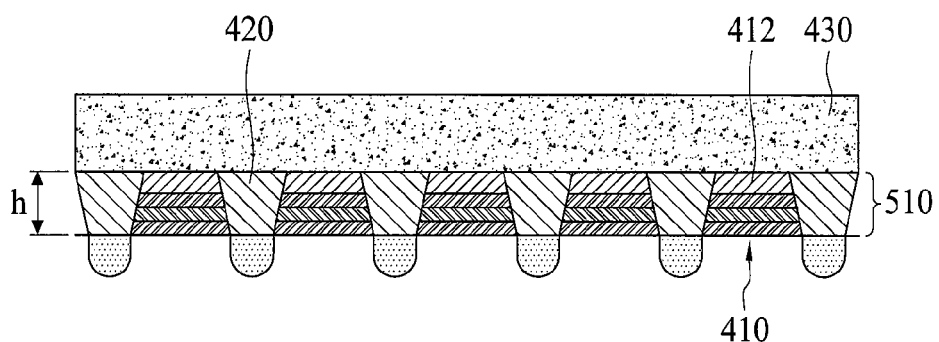
Figures 3, 5K:
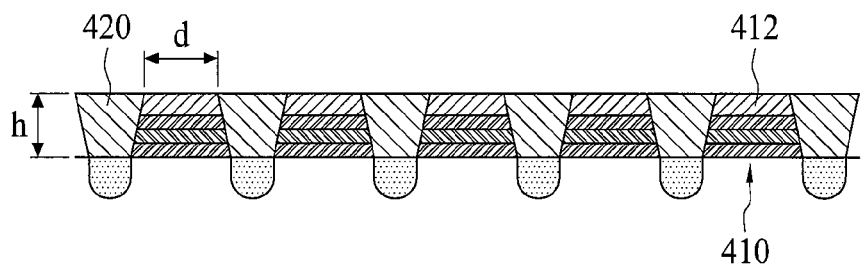

A conductive layer 430 is formed after the previous etch step as shown in FIGS. 5J-1 and 5J-2. A patterning step is further introduced to generate a plurality of conductive strips as depicted in FIG. 5K-1. The dotted circle 560 represents a unit of a semiconductor structure which is similar to the one as shown in FIG. 4. FIG. 5K-2 is the cross section along line AA' and FIG. 5K-3 is the cross section along line BB'.

In comparison to the conventional semiconductor structure, the sacrificial layer 418 as shown in FIG. 5H-2, which is preserved for a conventional semiconductor structure becomes unnecessary for the embodiments in the present invention before the conductive layer disposed.

In some embodiments, the mask layer 412 is a nitride film and is incorporated with an ONO (oxide nitride oxide) stack trapping layer 410 to form an ONON (oxide nitride oxide nitride) stack. In some embodiments, the mask layer 412 is a nitride film and removed by an wet etch such as hot $H_3PO_4$ before the conductive layer 430 is disposed on. In some embodiments, the remaining mask layer 412 on the trapping layer 410 is oxidized to a silicon oxide film and incorporated with the ONO (oxide nitride oxide) stack trapping layer 410 to form an ONO stack. The unit semiconductor structure illustrated in FIG. 4 is featured with ONO trapping layer stack.

Figure 6:
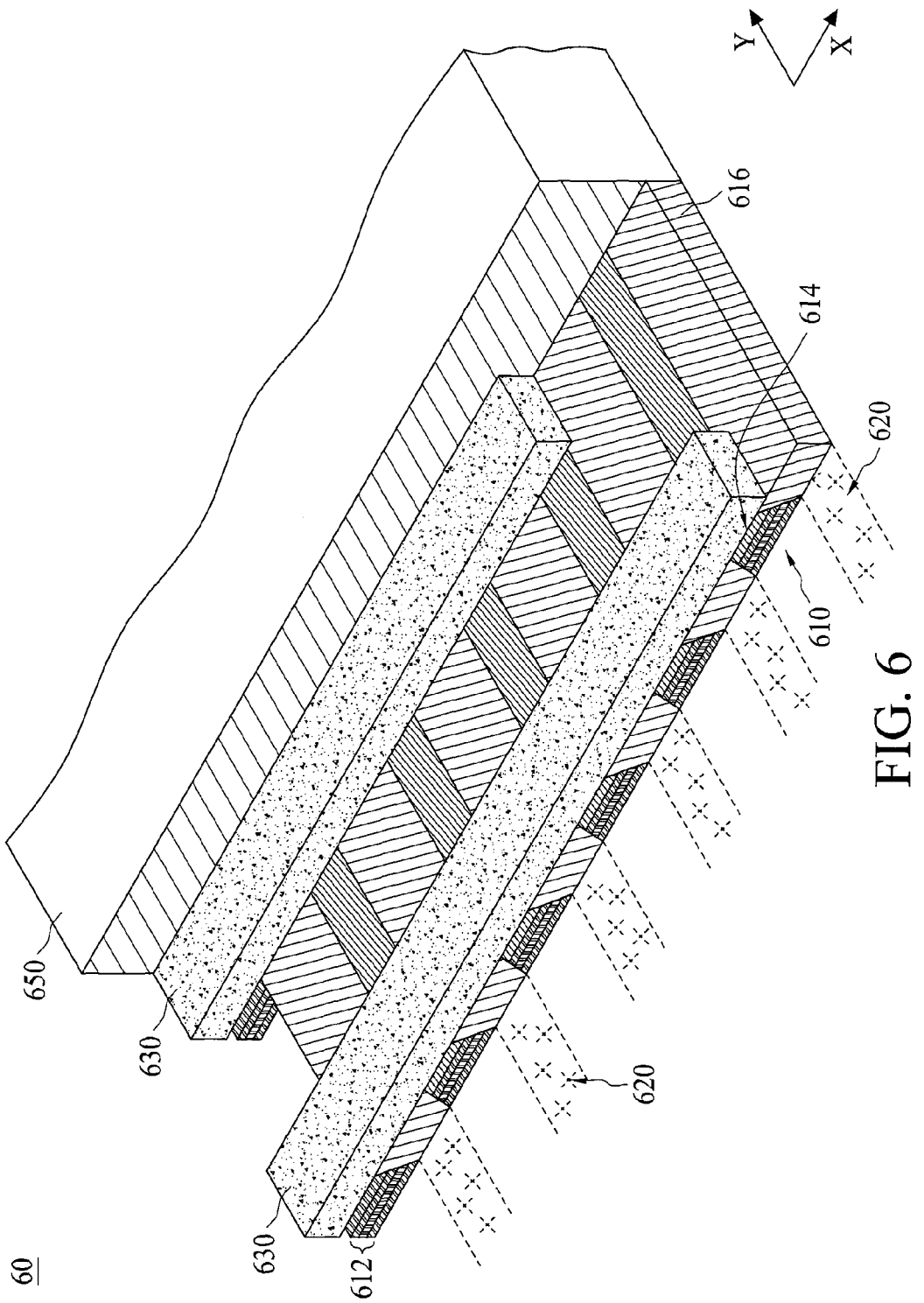
FIG. 6 illustrates a memory array according to the present disclosure.

FIG. 6 illustrates a memory array 60 which is covered by an inter dielectric layer 650. The memory array 60 has a plurality of conductive lines 630 arranged in a parallel manner. There are also a plurality of memory storage units 610 disposed on the substrate. Each storage unit 610 has a charge trapping layer stack 612 for storing the trapping charges. The conductive lines 630 is disposed on and physically in contact with the top surface of the charge trapping layer stack 612. In the present embodiment, there is a hard mask layer 614 such as nitride in between. Each conductive line 630 strings a plurality of storage unit 610 and configured as a wordline to receive the bias to operate selected storage unit. There are also a plurality of buried diffusion regions 620 laid in the substrate and extends along Y-direction which is orthogonal to the X-direction. Each strip of buried diffusion region 620 is configured to be the source/drain of each storage unit to separate adjacent storage units along the X-direction. The gap of adjacent storage units is filled with a dielectric layer 616. Each conductive line 630 is also a control gate for each attached storage unit 610 therewith. The charge trapping layer stack 612 can be an ONO film stack or other configuration for memory storage. In some embodiments, there is no hard mask layer 614 included in the storage unit 610.

Since the wordline 630 also replaces the control gate for each storage unit, the total thickness of the memory device as in FIG. 6 is reduced. This also provide the advantage of shrinking the volume of a die while the size of a semiconductor device becoming more and more critical.

The methods and features of this invention have been sufficiently described in the above examples and descriptions. It should be understood that any modifications or changes without departing from the spirit of the invention are intended to be covered in the protection scope of the invention.

What is claimed is:

1. A semiconductor structure, comprising:
   a first and a second doped region;
   a channel having a first length along a first direction, wherein the channel is between the first and the second doped region;
   a charge trapping layer stack on the channel;
   a pair of dielectric films located at both sides of the charge trapping layer stack and on top of the first and the second doped region, respectively, wherein a top surface of each of the dielectric film is coplanar with a top surface of the charge trapping layer stack; and
   a conductive layer on the charge trapping layer stack and extending along the first direction, wherein the conductive layer is configured as a control gate of the semiconductor structure and as a wordline for receiving an operation voltage for the semiconductor structure.

2. The semiconductor structure as in claim 1, wherein the conductive layer is in physical contact with a top surface of the charge trapping layer.

3. The semiconductor structure as in claim 1 further comprising a hard mask layer wherein the hard mask layer is between the conductive layer and the charge trapping layer stack.

4. The semiconductor structure as in claim 3, wherein the hard mask layer is silicon nitride.

5. The semiconductor structure as in claim 4, wherein the charge trapping layer stack incorporates the hard mask to form an ONON film stack.

6. The semiconductor structure as in claim 1 further comprising a thin dielectric layer wherein the thin dielectric layer is between the charge trapping layer stack and a substrate.

7. The semiconductor structure as in claim 1, wherein the charge trapping layer stack is an ONO film stack.

8. A memory array, comprising:
   a plurality of memory storage units wherein adjacent memory storage units along a first direction are separated by a buried diffusion region, wherein the buried diffusion regions extend along a second direction which is orthogonal to the first direction;
   a conductive line stringing the memory storage units along the first direction, wherein the conductive line is configured as a control gate and a wordline of the corresponding memory storage unit; and
   a dielectric film located between two adjacent memory storage units and on top of the buried diffusion region, wherein a top surface of the dielectric film is coplanar with a top surface of the memory storage unit.

9. The memory array as in claim 8, wherein each buried diffusion region is a source or drain of the corresponding memory storage unit.

10. The memory array as in claim 8 further comprising a charge trapping layer stack, wherein the charge trapping layer stack is between the conductive line and a substrate.

11. The memory array as in claim 10, wherein the conductive line is in physical contact with a top surface of the charge trapping layer stack.

12. The memory array as in claim 10 further comprising a hard mask layer wherein the hard mask layer is between the conductive layer and the charge trapping layer stack.

13. The memory array as in claim 12, wherein the hard mask layer is silicon nitride.

14. The memory array as in claim 10, wherein the charge trapping layer stack is an oxide-nitride-oxide (ONO) film stack.

15. A method of manufacturing a semiconductor structure, comprising:
   forming a plurality of buried diffusion strips in a substrate, wherein the buried diffusion strips extend along a first direction;
   forming a plurality of memory storage units on a substrate wherein the memory storage units are stringed by forming a wordline in a second direction which is orthogonal to the first direction, wherein the wordline is the configured as a control gate for each storage unit; and
   forming a dielectric film located between two adjacent memory storage units and on top of the buried diffusion region, wherein a top surface of the dielectric film is coplanar with a top surface of the memory storage unit.

16. The method as in claim 15, wherein each memory storage unit has a charge trapping layer stack disposed under the wordline.

17. The method as in claim 16 further comprising forming a hard mask layer between the charge trapping layer stack and the wordline.

18. The method as in claim 17, wherein the hard mask layer is silicon nitride.

19. The method as in claim 18 further comprising oxidizing the hard mask layer before forming the wordline.

20. The method as in claim 16, wherein the charge trapping layer stack is an oxide-nitride-oxide (ONO) film stack.

21. The method as in claim 16, wherein the wordline is in contact with a top surface of the charge trapping layer stack.

22. The method as in claim 15 further comprising forming a sacrificial layer before forming the wordline, wherein the sacrificial layer is configured to provide a mask for forming the buried diffusion strips at a predetermined location.

23. The method as in claim 22 further comprising removing the sacrificial layer before forming the wordline.

24. A method of manufacturing a semiconductor structure, comprising:
- forming a plurality of buried diffusion strips in a substrate, wherein the buried diffusion strips extend along a first direction;
- forming a plurality of memory storage units on a substrate wherein the memory storage units are stringed by forming a wordline in a second direction which is orthogonal to the first direction and each memory storage unit has a charge trapping layer stack disposed under the wordline, wherein the wordline is the configured as a control gate for each storage unit;
- forming a hard mask layer between the charge trapping layer stack and the wordline, wherein the hard mask layer is silicon nitride, and oxidizing the hard mask layer before forming the wordline; and
- forming a dielectric film located between two adjacent memory storage units, wherein a top surface of the dielectric film is coplanar with a top surface of the memory storage unit.

* * * * *